(12) United States Patent
Ogawa et al.

(10) Patent No.: US 6,753,548 B2
(45) Date of Patent: Jun. 22, 2004

(54) LASER HEAT TREATMENT METHOD, LASER HEAT TREATMENT APPARATUS, AND SEMICONDUCTOR DEVICE

(75) Inventors: Tetsuya Ogawa, Hyogo (JP); Hidetada Tokioka, Hyogo (JP); Yukio Sato, Hyogo (JP); Mitsuo Inoue, Hyogo (JP); Tomohiro Sasagawa, Hyogo (JP); Mitsutoshi Miyasaka, Nagano (JP)

(73) Assignees: Mitsubishi Denki Kabushiki Kaisha, Tokyo (JP); Seiko Epson Corporation, Tokyo (JP)

( * ) Notice: Subject to any disclaimer, the term of this patent is extended or adjusted under 35 U.S.C. 154(b) by 53 days.

(21) Appl. No.: 10/420,779

(22) Filed: Apr. 23, 2003

(65) Prior Publication Data

US 2003/0201466 A1 Oct. 30, 2003

Related U.S. Application Data

(62) Division of application No. 09/708,608, filed on Nov. 9, 2000, now Pat. No. 6,566,683, which is a continuation of application No. PCT/JP00/01375, filed on Mar. 8, 2000.

(30) Foreign Application Priority Data

Mar. 10, 1999 (JP) .............................. 11-63107
Mar. 31, 1999 (JP) .............................. 11-90439

(51) Int. Cl.$^7$ ............................................ H01L 29/04
(52) U.S. Cl. ..................................................... 257/53
(58) Field of Search .......................................... 257/53

(56) References Cited

U.S. PATENT DOCUMENTS

| | | | | |
|---|---|---|---|---|
| 4,309,225 A | * | 1/1982 | Fan et al. | 148/1.5 |
| 5,643,801 A | * | 7/1997 | Ishihar et al. | 250/492.1 |
| 5,936,291 A | * | 8/1999 | Makita | 257/405 |
| 5,953,597 A | | 9/1999 | Kusumoto et al. | |
| 5,959,779 A | * | 9/1999 | Kusomoto et al. | 438/161 |
| 5,981,974 A | * | 11/1999 | Makita | 257/72 |
| 6,020,224 A | * | 2/2000 | Shimogaichi et al. | 438/158 |

FOREIGN PATENT DOCUMENTS

| | | |
|---|---|---|
| EP | 0080597 A1 | 6/1983 |
| JP | 7-201735 | 8/1995 |
| JP | 8-51077 | 2/1996 |
| JP | 8-228006 | 9/1996 |
| JP | 10-64842 | 3/1998 |
| JP | 10-258383 | 9/1998 |
| JP | 11-71170 | 3/1999 |
| JP | 11-312815 | 11/1999 |
| JP | 2000-77333 | 3/2000 |
| JP | 2000-77353 | 3/2000 |
| JP | 2000-91264 | 3/2000 |
| JP | 2000-323428 | 11/2000 |

OTHER PUBLICATIONS

"Annular grain structures in pulsed laser recrystallized Si on amorphous insulators", G. K. Celler et al., Appl. Phys. Lett. 39(5), Sep. 1, 1981, pp. 425–427.

"Grain Enlargement in Polysilicon on Insulating Substrates Induced by Q–Switched Nd:YAG Laser Irradiation", R. J. Falster et al., Mat. Res. Soc. Symp. Proc. vol. 4, 1982, pp. 523–528.

"Nd–YAG Laser Induced Crystallization on a–Si:H Thin Films", J. Carvalho et al., Mat. Res. Soc. Symp. Proc., vol. 358, 1995, pp. 915–920.

"Dynamics of Lateral Grain Growth During the Laser Interference Crystallization of a–Si", G. Aichmayr et al., J. Appl. Phys., vol. 85, No. 8, Apr. 15, 1999, pp. 4010–4023.

* cited by examiner

*Primary Examiner*—Hoai Ho
(74) *Attorney, Agent, or Firm*—McDermott, Will & Emery

(57) ABSTRACT

The laser heat treatment of an amorphous or polycrystalline silicon film material is conducted by forming a laser beam generated from a pulse laser source having a wavelength of 350 nm to 800 nm into a linear beam having a width and a length, and directing the linear beam onto a film material formed on a substrate.

3 Claims, 11 Drawing Sheets

IN-FILM TEMPERATURE DISTRIBUTION

MELTING STATE

LASER HEAT TREATMENT METHOD, LASER HEAT TREATMENT APPARATUS, AND SEMICONDUCTOR DEVICE

REFERENCE TO RELATED APPLICATION

This application is a divisional of application Ser. No. 09/708,608 filed Nov. 9, 2000, now U.S. Pat. No. 6,566,683, which is a continuation of International Application No. PCT/JP00/01375, whose international filing date is Mar. 8, 2000, which in turn claims the benefit of Japanese Patent Application No. 11-63107, filed Mar. 10, 1999 and Japanese Patent Application No. 11-90439, filed Mar. 31, 1999, the disclosures of which Applications are incorporated by reference herein. The benefit of the filing and priority dates of the International and Japanese Applications is respectfully requested.

BACKGROUND OF THE INVENTION

1. Field of the Invention

The present invention relates to a laser heat treatment method and apparatus for forming a polycrystalline silicon film having an excellent crystalline property in order to fabricate a high-mobility thin film transistor, and a semiconductor device produced using such method and apparatus.

2. Description of the Background Art

At present, pixel portions of a liquid crystal panel produce an image by switching of thin film transistors that are formed from an amorphous or polycrystalline silicon film on a glass or synthetic quartz substrate. If a driver circuit (which is now typically independently mounted outside) for driving the pixel transistors can be simultaneously formed on the panel, significant advantages would be obtained in terms of production cost, reliability and the like of the liquid crystal panel. At present, however, since the silicon film forming an active layer of the transistor has a poor crystalline property, the thin film transistor has poor capability in terms of mobility and the like, thereby making it difficult to make an integrated circuit that requires high speed and functionality. Laser heat treatment is commonly conducted as a way to improve the crystalline property of the silicon film in order to fabricate a high-mobility thin film transistor.

The relationship between the crystalline property of the silicon film and the mobility of the thin film transistor is described as follows: in general, the silicon film resulting from the laser heat treatment is a polycrystalline film. Crystal defects are locally present at polycrystalline grain boundaries, which inhibit carrier movement in the active layer of the thin film transistor. Accordingly, in order to increase the mobility of the thin film transistor, it is only necessary to reduce the number of times for the carriers to move across the grain boundaries while moving in the active layer, and to reduce a crystal-defect density. The purpose of laser heat treatment is to form a polycrystalline silicon film having a large grain size and also having a small number of crystal defects at the crystal boundaries.

FIG. 11 is a diagram showing one example of a conventional laser heat treatment apparatus. In FIG. 11, a pulse laser source 501 is an excimer laser source (such as KrF (wavelength of 248 nm) and XeCl (wavelength of 308 nm)) that is a typical pulse laser source of a wavelength less than 350 nm for emitting ultraviolet light commonly used as heat treatment laser. Excimer laser light 502 is emitted from pulse laser source 501. A beam homogenizer 503 makes an intensity distribution of excimer laser light 502 uniform. A focusing optical system 504 focuses excimer laser light 502. An amorphous silicon film 505 is disposed so that it is subjected to the laser heat treatment. Amorphous silicon film 505 is formed on an underlying silicon oxide film 506 on a glass or quartz substrate 507.

Hereinafter, a conventional laser heat treatment method is described. Excimer laser light 502 emitted from pulse laser source 501 is directed through beam homogenizer 503 onto amorphous silicon film 505 by focusing optical system 504. Amorphous silicon film 505 is melted in the region irradiated with excimer laser light 502. Then, as the temperature is reduced, the melted silicon is crystallized to form a polycrystalline silicon film. Since silicon has an extremely high absorption coefficient for the excimer laser light, heat treatment can be efficiently conducted even to a thin silicon film. However, due to the excessively high absorption coefficient, the laser light will be absorbed by the time it advances about 10 nm from the surface. A melting process of amorphous silicon film 505 is shown in FIGS. 12A to 12D. FIG. 12A shows a state of silicon film 505 upon irradiation of the laser light in the direction shown by P; FIG. 12B shows a state obtained several tens of nanoseconds after the irradiation; FIG. 12C shows a state obtained several tens of nanoseconds after FIG. 12B; and FIG. 12D shows a state after the crystal growth. Upon irradiation of the laser, silicon film 505 has a melting-depth distribution and temperature distribution corresponding to a Gaussian beam profile 601 shown in FIG. 12A, and a melted portion 603 of the silicon film is produced. Heat is generally conducted at a certain spreading angle. Therefore, as the melting depth is increased by the heat conduction, these distributions become broader as shown in FIG. 12B, resulting in the uniform distributions as shown in FIG. 12C. Thus, melted portion 603 of the silicon film is formed. Accordingly, since there is no lateral temperature distribution, recrystallization proceeds in the vertical direction, whereby the resultant crystal grains 604 have a vertically elongated shape as shown in FIG. 12D. In other words, the crystal grain size is reduced in the direction of the plane in which the carriers move.

FIG. 13 shows dependence of the mobility (n-channel) of a MOS transistor on the irradiation energy density of laser light, wherein the MOS transistor has its active layer formed from the polycrystalline silicon film thus obtained. FIG. 13 shows a result with the use of a KrF excimer laser source as pulse laser source 501 (FIG. 11), and pulse duration is about 15 nsec (FWHM). In addition, silicon oxide film 506 and amorphous silicon film 505 have a thickness of 200 nm and 50 nm, respectively. Herein, a laser-irradiation area is defined as an area having an irradiation intensity that is $1/e^2$ times or more of the peak value, and the irradiation energy density was calculated from the radiant laser energy. As can be seen from FIG. 13, under the laser-heat-treatment conditions as described above, the maximum mobility of 80 $cm^2/Vs$ was obtained by setting the excimer-laser irradiation energy density to 230 $mJ/cm^2$, and about 80 percent or more of the maximum mobility was obtained in the range of ±5 $mJ/cm^2$ therefrom. However, such mobility is still insufficient to make a high-speed, high-functionality integrated circuit. Moreover, as shown in FIG. 13, the mobility is highly dependent on the irradiation energy density. Therefore, in introducing such a method in the production line, the produced transistors will have variation in their characteristics unless laser output and focusing capability of the optical system are highly strictly controlled. The reason for this can be considered as follows: since silicon has a high absorptance of the excimer laser light, a melting state thereof is varied with a slight change in the irradiation energy density, so that a recrystallization process is changed.

In terms of an enhancement of grain size of the polycrystalline silicon film, an attempt has been made in articles to conduct laser heat treatment with long-wavelength laser light of 350 nm or more (Reference 1 (Appl. Phys. Lett. 39, 1981, pp. 425–427), Reference 2 (Mat. Res. Soc. Symp. Proc., Vol. 4, 1982, pp. 523–528), and Reference 3 (Mat. Res Soc. Symp. Proc., Vol. 358, 1995, pp. 915–920). Herein, a second harmonic of Nd:YAG laser (wavelength of 532 nm) is used as the long-wavelength laser light of 350 nm or more. In these reported examples, a beam profile at the irradiated position corresponds to an axisymmetric Gaussian distribution. According to References 1 and 2, a recrystallization process of the laser heat treatment using the second harmonic of Nd:YAG laser is described as follows: description is herein given with reference to FIGS. 14A to 14D. As shown in FIG. 14A, when a focused laser beam 611 having Gaussian beam profile 601 is directed from focusing optical system 504 onto silicon film 505 in the direction shown by P, a temperature distribution 612 that is very close to the Gaussian distribution is produced within silicon film 505. Therefore, a melted portion 613 is formed in a melting state as shown in FIG. 14B. In a shallow portion C of the melting depth in FIG. 14B, a longitudinal temperature distribution is produced due to the heat loss mainly toward the substrate. As a result, a three-dimensional, isotropic crystal growth 614 occurs in the vertical direction as shown in FIG. 14C, whereby the recrystallized grain size is limited to a value as low as several hundreds of nanometers by the shallow melting depth. However, a portion D melted up to the interface with the substrate in FIG. 14B has a large temperature gradient in the lateral direction, resulting in a different recrystallization process 615 as shown in FIG. 14D. More specifically, the vertically grown crystal having a small grain size serves as seed crystal for lateral recrystallization toward the center having a high temperature. As a result, large crystal grains having a diameter of several micrometers are produced in the plane in which the carriers move.

In these reported examples, however, the axisymmetric Gaussian beam profile causes a significant problem. Since the profile is axisymmetric at the irradiated position, crystal grains 616 grow radially as shown in FIG. 15. Accordingly, a MOS transistor having its active layer formed from this polycrystalline silicon film has such a structure as shown in FIG. 16. In FIG. 16, the transistor includes a source 701, a drain 702, a channel 704 interposed between source 701 and drain 702, and a gate 703 formed over channel 704. The active layer, which includes source 701, drain 702 and channel 704, is formed from the polycrystalline silicon film. Crystal grains 616 do not have the same orientation in channel 704 in which the carriers move. Since the carriers are scattered at the boundary planes of crystal grains 616 having different orientations, the carrier mobility is reduced. Moreover, since individual crystal grains have grown in a centrosymmetric manner, a gap, i.e., dislocation, a kind of crystal defects, is likely to be produced between the individual crystal grains, thereby increasing a crystal-defect density. Therefore, the polycrystalline silicon film resulting from the laser heat treatment has an extremely poor quality in terms of in-plane uniformity, and no successful thin film transistor has been reported so far.

Hereinafter, the relationship between the thickness of a silicon film and a MOS transistor is described. In general, as the silicon film forming the active layer becomes thinner, an s-factor as defined by $dV_G/d(\log I_{DS})$ (where $V_G$ is a gate voltage, and $I_{DS}$ is a drain current) is reduced, whereby a threshold voltage is reduced. As a result, a driving voltage of the transistor is reduced, thereby achieving significant reduction in power consumption. Therefore, such a transistor is highly advantageously mounted in portable information terminals, a main application of the liquid crystal panels. However, since the silicon films used in References 1 and 2 are as thick as 0.2 to 1 μm, they are not expected to practically function as a transistor due to their high threshold voltage and power consumption.

The laser heat treatment is usually conducted with a substrate being moved for large-area laser heat treatment. For the uniform quality of the resultant film, the substrate is commonly moved by a distance less than a beam width during each interval of the laser-pulse irradiation, so that the laser is directed onto the same portion a plurality of times. According to Reference 3, it is desirable to direct the laser onto the same portion two hundred times or more. This is because of an increased X-ray diffraction peak intensity and reduced resistance of the silicon film after the laser heat treatment. Although Reference 3 does not mention the surface roughness, such a large number of times of irradiation generally produces significant surface roughness, and also causes partial ablation as well as removal of the silicon film from the substrate. In making a coplanar or staggered MOS transistor having its active layer formed from a polycrystalline silicon film, a gate oxide film is short-circuited if the surface roughness is large. Moreover, the MOS transistor itself cannot be formed if the silicon film is partially removed away.

In the conventional heat treatment using excimer laser, i.e., typical pulse laser having a wavelength of 350 nm or less, as a light source, a crystal grain size is small due to the vertical recrystallization growth, and the resultant thin film transistor has mobility as low as about 80 $cm^2/V_S$. Moreover, since the mobility is highly dependent on the irradiation energy density, constant mobility cannot be obtained, causing variation in characteristics of the resultant transistors.

On the other hand, in the conventional laser heat treatment using a second harmonic of Nd:YAG laser in order to enlarge crystal grains and thus increase the mobility of the thin film transistor, individual crystal grains do not have the same orientation due to the use of an axisymmetric Gaussian beam. Therefore, the resultant thin film transistor has low mobility and high crystal-defect density at the grain boundaries.

Moreover, in order to improve a crystal quality, as many as 200 shots or more of the laser is directed onto the same portion. Thus, the gate oxide film of the MOS transistor is short-circuited due to the large surface roughness, or the thin film transistor cannot be made due to ablation of the silicon film.

It is an object of the present invention to provide a laser heat treatment method for forming a thin film having an excellent crystalline property that is required to make a high-performance thin film transistor.

It is another object of the present invention to provide a productive, stable laser heat treatment method.

It is still another object of the present invention to provide a semiconductor device capable of operating at a high speed at low cost.

It is yet another object of the present invention to provide a laser heat treatment apparatus for conducting laser heat treatment to form a thin film having an excellent crystalline property.

SUMMARY OF THE INVENTION

A laser heat treatment method according to one aspect of the present invention comprises the steps of: forming a laser beam generated from a pulse laser source having a wavelength of 350 nm to 800 nm into a linear beam having a width and length; and directing the linear beam onto a film material formed on a substrate. According to this laser heat treatment method, a high-quality thin film having a large crystal grain size can be stably obtained.

In the laser heat treatment method of the present invention, the length of the linear beam is preferably ten times or more of the width thereof. In this case, lateral crystal growth can be reliably achieved, whereby a high-quality polycrystalline film can be obtained.

A laser heat treatment method according to another aspect of the present invention comprises the steps of: forming a laser beam generated from a pulse laser source having a wavelength of 350 nm to 800 nm into a linear beam having a width and length; and directing the linear beam onto a film material formed on a substrate, wherein the linear beam has an energy density gradient of 3 mJ/cm$^2$/μm or more in the width direction thereof. According to this laser heat treatment method, a higher-quality thin film having a larger crystal grain size can be stably obtained.

In the laser heat treatment method according to the another aspect of the present invention, an energy-density distribution in the width direction of the linear beam preferably has an approximately Gaussian profile. In this case, a post-anneal effect can be expected to be obtained.

In the laser heat treatment method according to the another aspect of the present invention, an energy-density distribution in the width direction of the linear beam preferably has an approximately top-flat profile. In this case, a peak value that causes ablation is suppressed, so that a gradient of the irradiation energy-density distribution can be increased.

In the laser heat treatment method according to the another aspect of the present invention, an energy-density distribution in the length direction of the linear beam preferably has an approximately top-flat profile of which standard deviation is 0.3 or less provided that an average intensity of the flat portion is 1. In this case, requirements regarding the performance of a beam-profile-forming optical system are reduced, whereby reduction in cost can be achieved.

In the laser heat treatment method of the present invention, the pulse laser source is preferably a harmonic of Q-switched oscillating solid-state laser using Nd ion- or Yb ion-doped crystal or glass as an excitation medium. In this case, efficient, stable heat treatment can be conducted.

In the laser heat treatment method of the present invention, the pulse laser source more preferably is any one of a second or third harmonic of Nd:YAG laser, a second or third harmonic of Nd:glass laser, a second or third harmonic of Nd:YLF laser, a second or third harmonic of Yb:YAG laser, or a second or third harmonic of Yb:glass laser. In this case, stable, productive heat treatment can be conducted at low cost.

In the laser heat treatment method of the present invention, the laser beam generated from the pulse laser source preferably has energy of 0.5 mJ or more per pulse. In this case, productive heat treatment can be conducted.

In the laser heat treatment method of the present invention, the laser beam generated from the pulse laser source preferably has pulse duration of less than 200 nsec. In this case, efficient heat treatment can be conducted.

In the laser heat treatment method of the present invention, an amorphous or polycrystalline silicon film is preferably used as the film material. In this case, heat treatment can be conducted with stable characteristics.

In the laser heat treatment method of the present invention, the amorphous or polycrystalline silicon film preferably has a thickness of less than 200 nm. In this case, a large grain size can be obtained, whereby excellent laser heat treatment can be achieved.

In the laser heat treatment method of the present invention, the number of pulses of the pulse laser light directed onto the same portion of the amorphous or polycrystalline silicon film is preferably 100 pulses or less. In this case, a polycrystalline film having an excellent surface state can be obtained.

In the laser heat treatment method of the present invention, the irradiation energy density at a surface of the amorphous or polycrystalline silicon film is preferably in the range from 100 mJ/cm$^2$ to 1,500 mJ/cm$^2$. In this case, a polycrystalline film having an excellent surface state can be obtained.

A semiconductor device according to still another aspect of the present invention comprises a plurality of transistors each including an active layer. A laser beam generated from a pulse laser source having a wavelength of 350 nm to 800 nm is formed into a linear beam having a width and length, and the linear beam thus obtained is directed onto a film material formed on a substrate. Thus, the active layer is formed from the heat-treated film material on the substrate. At least one of the plurality of transistors, and preferably, a transistor operated at a higher frequency, has a drain current flowing in the direction approximately parallel to the width direction of the linear beam. In this case, a device operating at a high speed can be obtained at low cost.

In a laser heat treatment apparatus according to still another aspect of the present invention comprises a pulse laser source having a wavelength of 350 nm to 800 nm, and beam-forming optical means for forming a laser beam generated from the pulse laser source into a linear beam. By using this laser heat treatment apparatus, excellent heat treatment can be conducted in making a polycrystalline silicon film.

In the laser heat treatment apparatus of the present invention, the pulse laser source is preferably a harmonic of Q-switched oscillating solid-state laser using Nd ion- or Yb ion-doped crystal or glass as a laser excitation medium. In this case, a stable apparatus can be provided.

In the laser heat treatment apparatus of the present invention, the pulse laser source more preferably is any one of a second or third harmonic of Nd:YAG laser, a second or third harmonic of Nd:glass laser, a second or third harmonic of Nd:YLF laser, a second or third harmonic of Yb:YAG laser, or a second or third harmonic of Yb:glass laser. In this case, a stable, efficient apparatus can be provided at low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
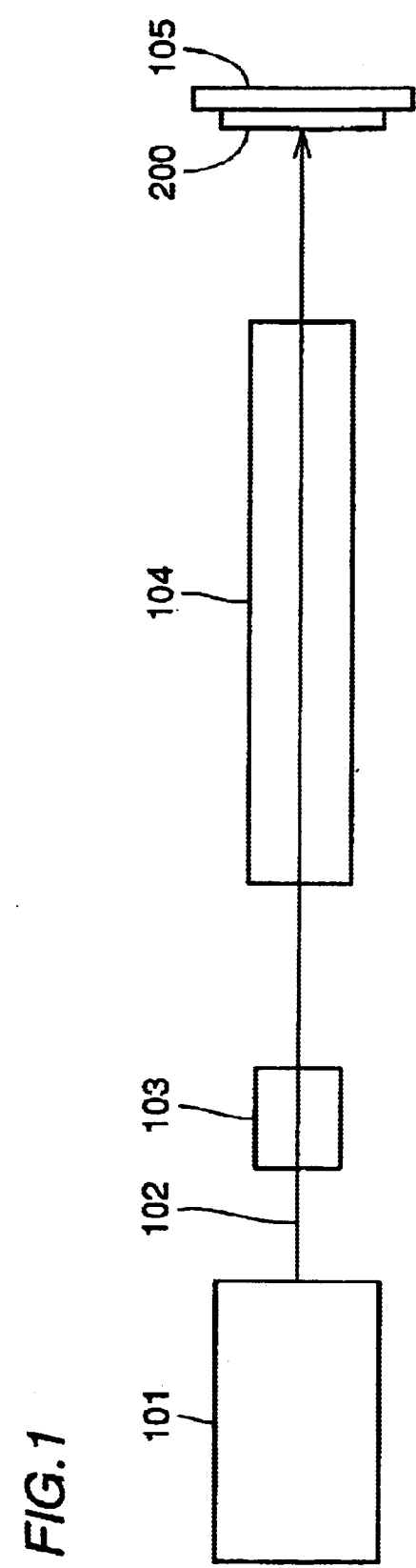
FIG. 1 is a diagram showing a conceptual structure of a laser heat treatment apparatus as an embodiment of the present invention.
Figure 2:
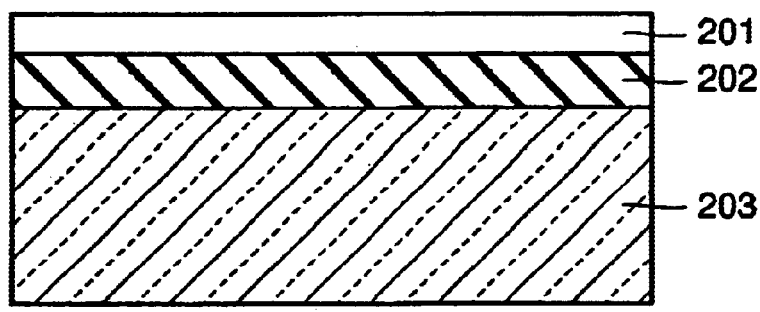
FIG. 2 is a schematic cross section showing a structure of a target to be subjected to the laser heat treatment of FIG. 1.

FIG. 1 is a diagram showing the structure of an apparatus for embodying a laser heat treatment method of the present invention. In FIG. 1, a second-harmonic oscillator 101 of Nd:YAG laser used as a pulse laser source emits laser light (wavelength of 532 nm) 102. A variable attenuator 103 adjusts the intensity of laser light 102. A beam-forming optical system 104 converts laser light 102 into a linear beam. A target 200 is disposed on a mobile stage 105. Laser light 102 enters linear-beam-forming optical system 104 after being adjusted to a prescribed intensity by variable attenuator 103. The laser light is converted to a linear beam profile by the linear-beam-forming optical system 104, and thereafter, directed onto target 200 for laser heat treatment. A substrate of target 200 is disposed on mobile stage 105, so that the substrate can be moved during laser irradiation. Target 200 is also shown in detail in FIG. 2. As shown in FIG. 2, a silicon oxide film having a thickness of 200 nm is formed as an underlying film 202 on a glass substrate 203 by CVD (Chemical Vapor Deposition). An amorphous silicon film 201 having a thickness of 70 nm is formed thereon as a film material on the substrate by LPCVD (Low Pressure Chemical Vapor Deposition). The substrate thus obtained is used as target 200.

Figure 3:
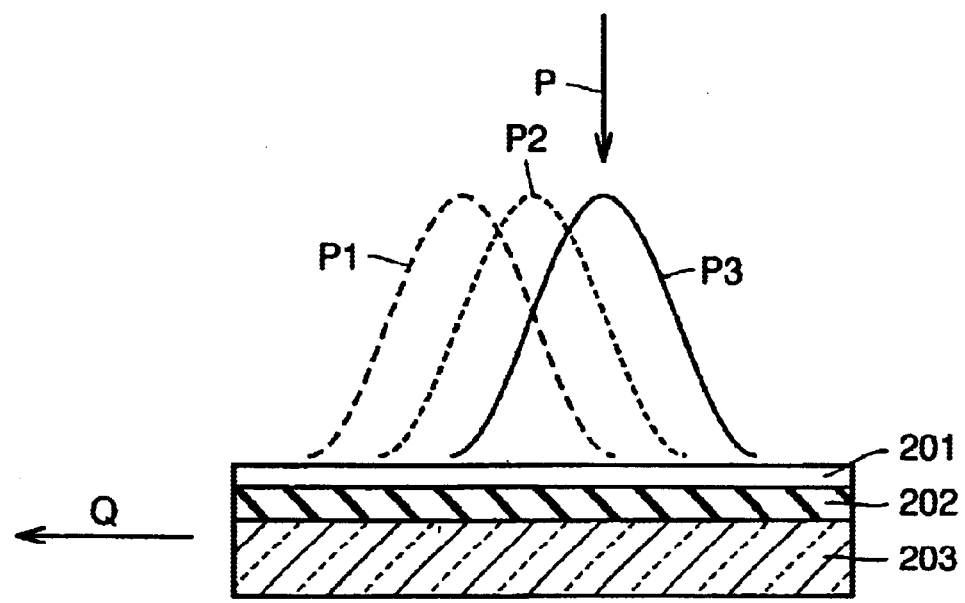
FIG. 3 is a diagram showing how laser light is directed onto the same portion a plurality of times.

The laser beam is directed while moving the mobile stage in the direction orthogonal to the length direction of the linear beam having an approximately rectangular transverse cross section, i.e., in the width direction of the linear beam. When the stage is moved by a distance larger than the linear-beam width during each pulse interval of the laser light irradiation, the laser pulse is directed once to the same portion. However, when such a distance is smaller than the linear-beam width, the laser light is directed to the same portion a plurality of times as shown in FIG. 3. In FIG. 3, the laser pulse is directed in the direction shown by P. By directing the laser pulse in the direction shown by P while moving substrate 203 in the direction shown by Q, the pulse before previous one has a laser beam profile shown by P1, the previous pulse has a laser beam profile shown by P2, and the current pulse has a laser beam profile shown by P3. Since the respective laser beam profiles of the pulses partially overlap each other, the laser light is directed onto the same portion of silicon film 201 a plurality of times.

Figure 4A:
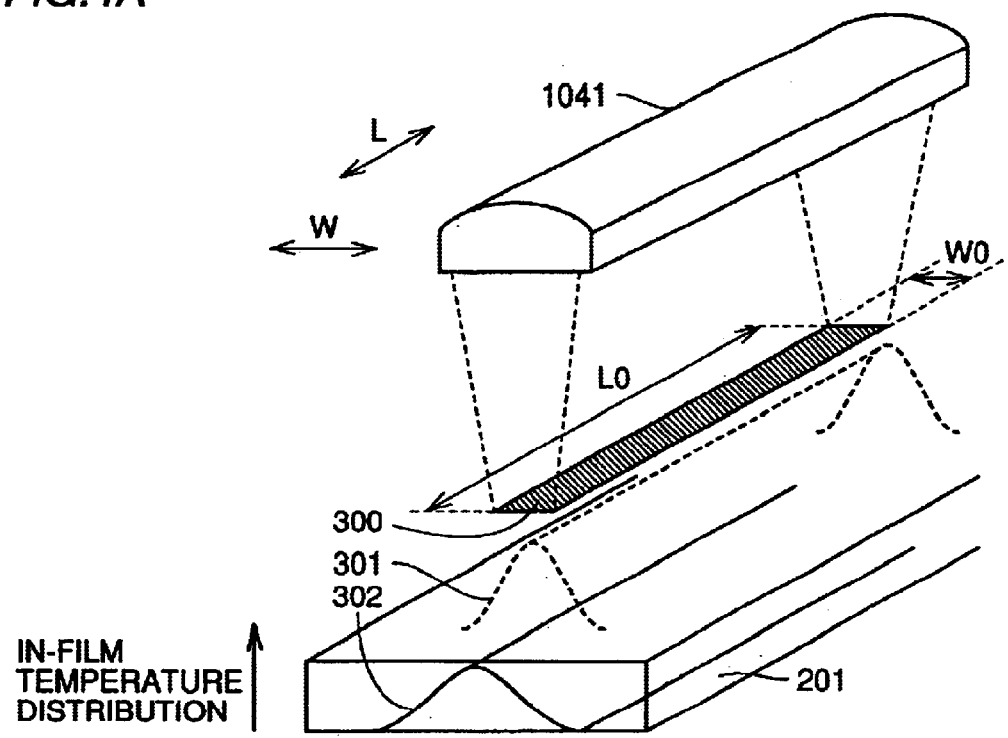
FIG. 4A is a diagram schematically showing a linear beam profile of the present invention.
Figure 4B:
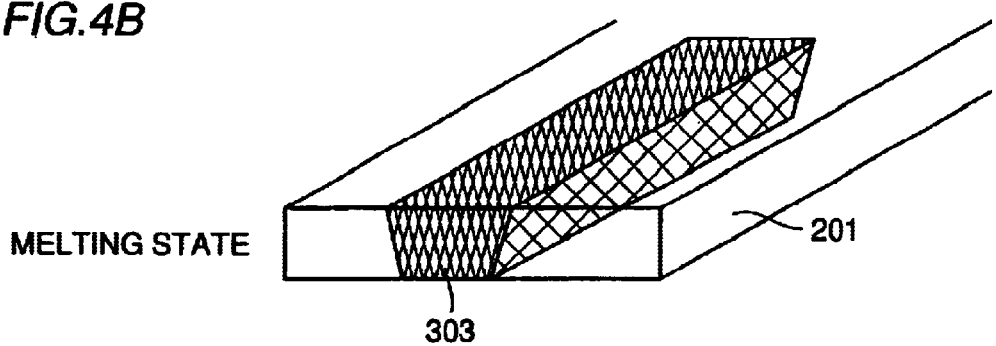
FIG. 4B is a diagram schematically showing how a film material on the substrate is melted.
Figure 5:
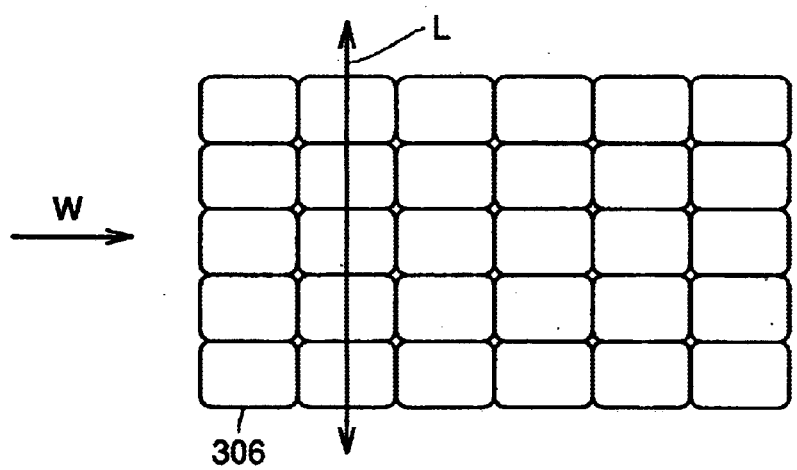
FIG. 5 is a schematic diagram showing a polycrystalline silicon film formed by a laser heat treatment method of the present invention.

FIGS. 4A and 4B are conceptual diagrams at the time amorphous silicon film 201 is melted by laser-beam irradiation. A focusing lens 1041 located at an output portion of linear-beam-forming optical system 104 of FIG. 1 focuses a linear beam 300 having a length L0 and a width W0 onto amorphous silicon film 201 for irradiation. A focused laser-beam profile 301 is a top-flat profile having an uniform profile in the length direction L of linear beam 300 and, for example, a Gaussian profile in the width direction W thereof, as shown by the dotted line in FIG. 4A. In the present invention, with a heat treatment method using a linear beam of a second harmonic of Nd:YAG laser, the silicon film is heated approximately uniformly in its thickness direction due to a small absorption coefficient of the amorphous silicon for the second harmonic. A lateral temperature distribution 302 in the silicon film 201 resulting from the laser irradiation is produced only in the direction orthogonal to the length direction L of linear beam 300. Accordingly, as shown in FIG. 4B, amorphous silicon film 201, a film material on the substrate, is melted entirely in the depth direction at a portion of a prescribed beam intensity or more. In other words, a line-distributed melted portion 303 spreading entirely in the depth direction is produced. Therefore, due to the small temperature distributions in the depth direction as well as in the length direction L of linear beam 300, the crystal growth proceeds one-dimensionally in the lateral direction, i.e., in the width direction W of linear beam 300. Thus, large crystal grains having a grain size of about several micrometers are produced. Moreover, as shown in FIG. 5, all the crystal grains 306 of the polycrystalline silicon film resulting from the laser heat treatment are oriented in the crystal-growth direction, i.e., in the width direction W of the linear beam that is orthogonal to the length direction L of the linear beam. In other words, they are oriented in the moving (scanning) direction of the mobile stage.

It should be noted that, although conventional excimer-laser heat treatment uses a linear beam, such heat treatment is conducted based on a concept completely different from that of the present invention. As described above with reference to FIGS. 12A to 12D, recrystallization using excimer laser is the growth in the thickness direction of the film. Therefore, in-plane orientation of individual grains is irregular, causing random crystal orientation at their boundary planes. Accordingly, unlike the heat treatment of the present invention using the linear beam of the second harmonic of Nd:YAG laser, such variation in the crystal orientation at the boundary planes of the individual crystal grains cannot be eliminated. In this respect as well, there is an essential limitation in terms of obtaining high mobility of the transistor. The only purpose of using the linear beam in the excimer laser heat treatment is to assure the in-plane uniformity of the film quality, and to improve the production capability. In contrast, according to the present invention, the linear beam is used in the heat treatment with the second harmonic of Nd:YAG laser. Thus, high-quality crystal having a large grain size is formed, thereby successfully increasing the mobility of the transistor.

Hereinafter, actual data of the present invention is described. The second harmonic of Nd:YAG laser used as a pulse laser source had pulse energy of 20 mJ/pulse, and pulse duration of 60 nsec (FWHM. Moreover, the irradiated area of the silicon film surface was 50 $\mu$m×10 mm. Experimentation was conducted with the laser-light energy being adjusted by variable attenuator 103 of FIG. 1 to the irradiation energy density of 300 to 1,500 mJ/cm$^2$. The laser was directed onto the same portion of the silicon film twenty times. Note that the atmosphere was in the air, and the substrate temperature was a room temperature.

Figure 6:
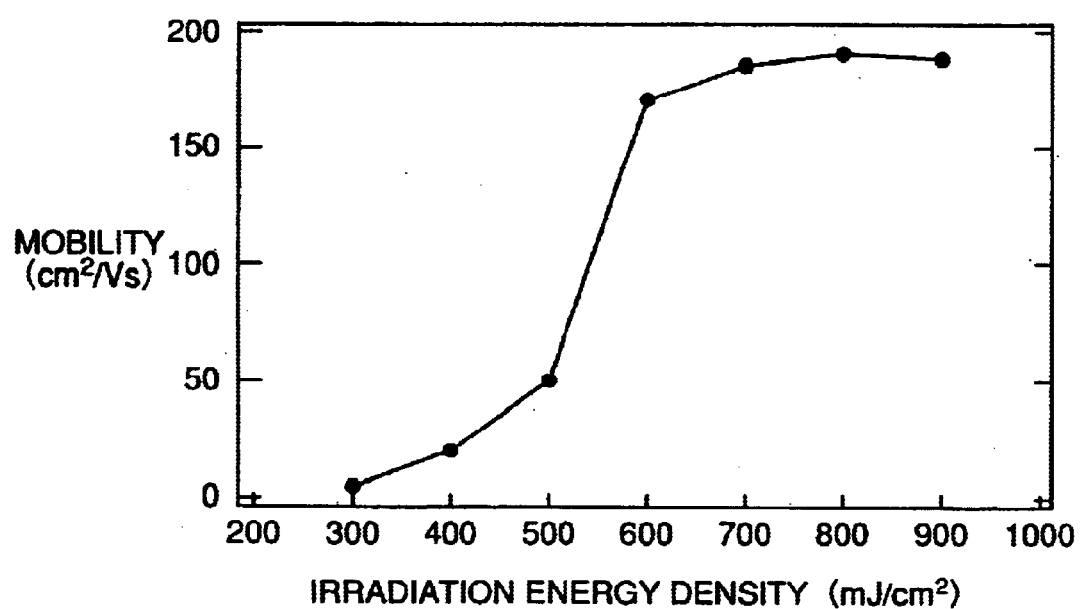
FIG. 6 is a diagram showing dependence of mobility of an NMOS transistor on irradiation energy density, wherein the NMOS transistor has its active layer formed from a polycrystalline silicon film obtained by a laser heat treatment method of the present invention.

Laser heat treatment of an amorphous silicon film was conducted under such conditions, thereby making a planar MOS transistor having its active layer formed from the resultant polycrystalline silicon film. The transistor was made so as to have a drain current flowing in the width direction of the beam, i.e., in the crystal-growth direction. The channel length and width are 5 $\mu$m and 10 $\mu$m, respectively. Dependence of the n-channel mobility on the irradiation energy density is shown in FIG. 6.

So far, no thin film transistor has been reported which has its active layer formed from a polycrystalline silicon film on a glass substrate by the laser heat treatment using the second harmonic of Nd:YAG laser. The present invention is the first to make such a thin film transistor. As shown in FIG. 6, the MOS transistor has n-channel mobility close to 200 cm$^2$/Vs at the irradiation intensity of 600 mJ/cm$^2$ or more, achieving the capability twice that obtained by excimer laser. The mobility of the transistor has extremely low dependence on the irradiation energy density, so that an acceptable range of the irradiation energy density for obtaining 80% or more of the maximum mobility is extremely wide, i.e., ±200 mJ/cm$^2$ or more.

Figure 13:
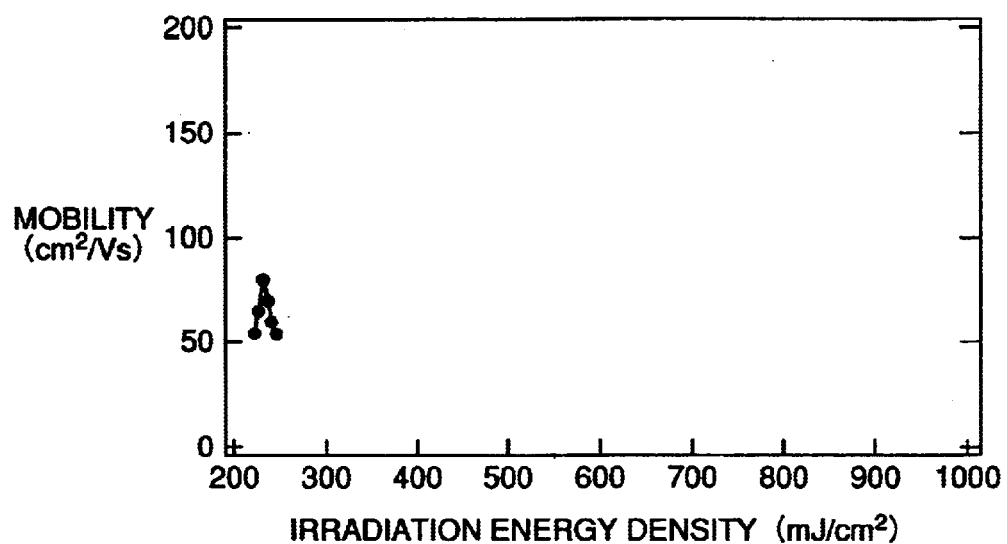
FIG. 13 is a diagram showing dependence of mobility of a conventional NMOS transistor on irradiation energy density, wherein the NMOS transistor has its active layer formed from a polycrystalline silicon film obtained by excimer laser heat treatment.
Figure 14A:
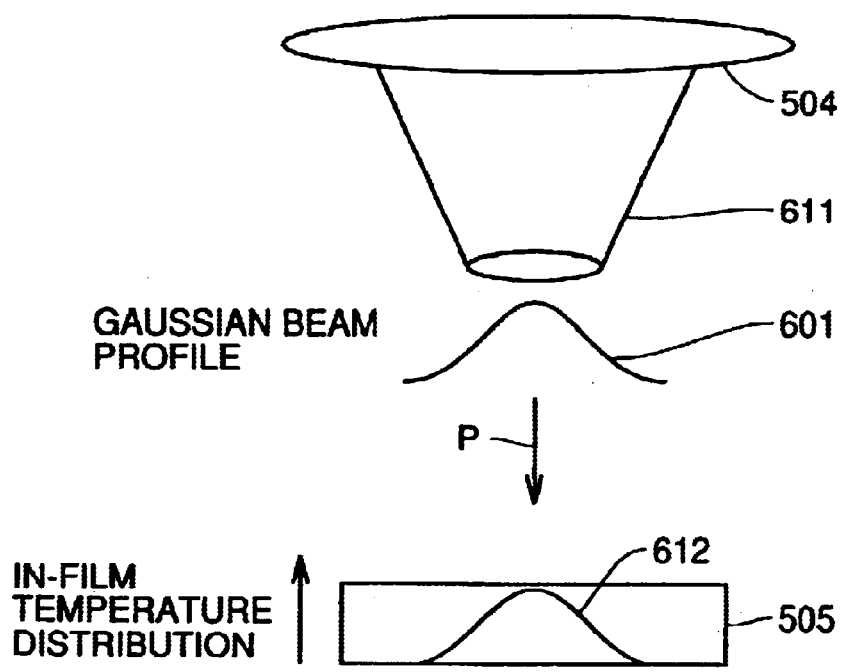
FIGS. 14A to 14D are diagrams schematically illustrating a conventional heat treatment process using a second harmonic of Nd:YAG laser.
Figure 14B:
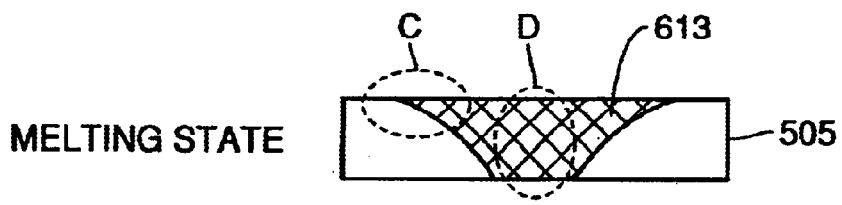
Figure 14C:
Figure 14D:
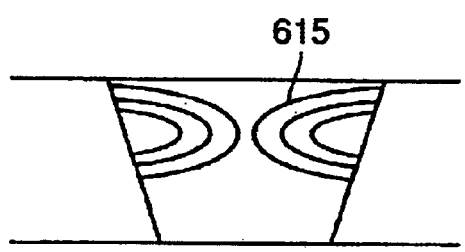
Figure 15:
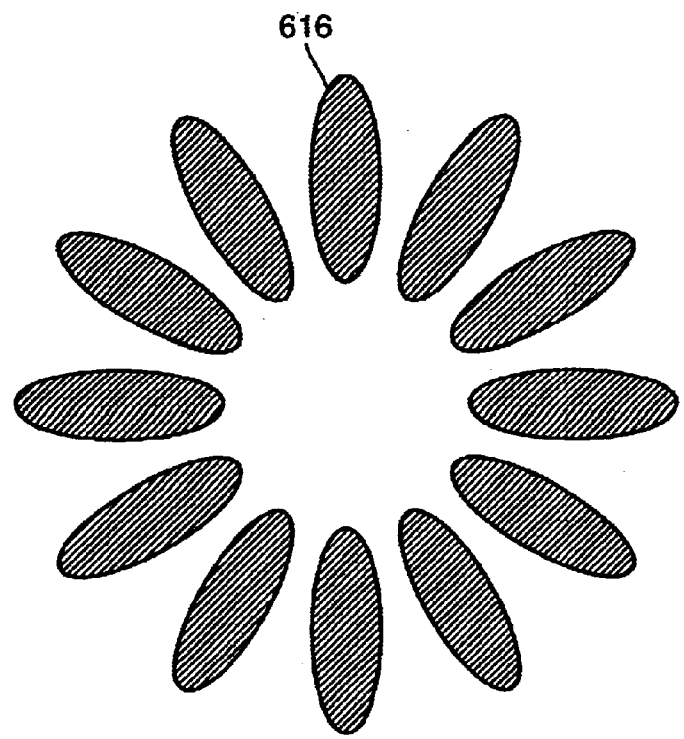
FIG. 15 is a schematic diagram showing crystal grains formed by conventional heat treatment using a second harmonic of Nd:YAG laser having a Gaussian profile.
Figure 16:
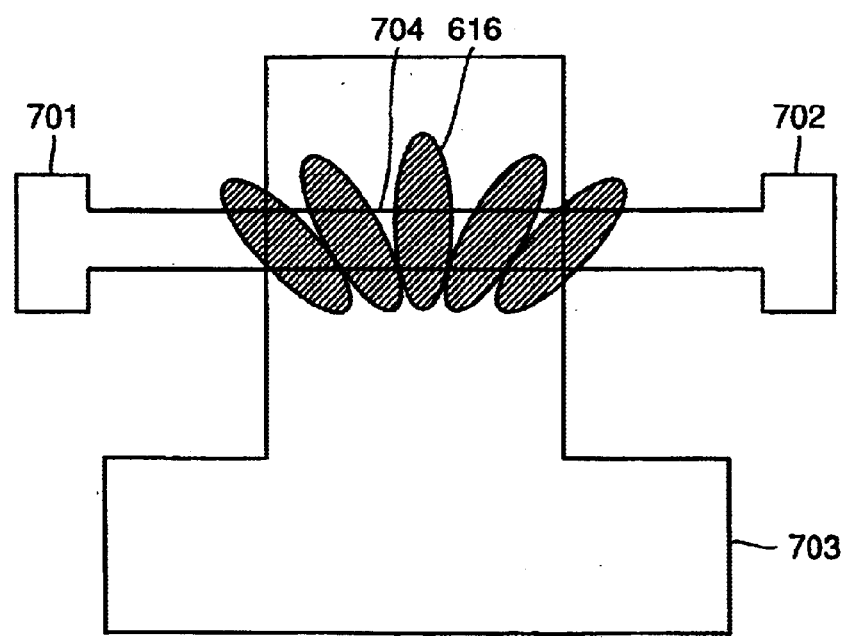
FIG. 16 is a schematic diagram showing a MOS transistor having its active layer formed from a polycrystalline silicon film formed by the conventional heat treatment using a second harmonic of Nd:YAG laser having a Gaussian profile.

In contrast, as shown previously in FIG. 13, the MOS transistor having its active layer formed from the polycrystalline silicon film formed by the excimer-laser heat treatment has the maximum n-channel mobility of only about 80 cm$^2$/Vs at the irradiation energy density of 230 mJ/cm$^2$. The mobility is highly dependent on the irradiation energy density, so that an acceptable range of the irradiation energy density for obtaining 80% or more of the maximum mobility is extremely narrow, i.e., ±5 mJ/cm$^2$. This causes a significant disadvantage in actual production. In addition, since the polycrystalline silicon film has been grown in the vertical direction, the grain size thereof is as small as about several hundreds of nanometers at the irradiation energy density of the maximum mobility, i.e., at 230 mJ/cm$^2$.

It is thus apparent that, in the case of the second harmonic of Nd:YAG laser, the acceptable range of the irradiation intensity is several tens of times wider than that in the case of the excimer laser. In other words, it is apparent that such laser heat treatment has an innovative feature that overthrows a common knowledge that the laser heat treatment is unstable. As a result, stability and reliability that have been considered impossible can be obtained in the production process. Moreover, since the second harmonic of Nd:YAG laser causes the lateral crystal growth, the resultant grain size is about several micrometers, which means that the order of the grain size is increased by one from that in the case of the excimer laser. Thus, a significant advantage can be obtained by the heat treatment itself.

Although silicon has been herein described as the film material, it should be understood that silicon carbide (SiC), or a material consisting only of carbon, or a compound semiconductor, or a dielectric compound, or a high-temperature superconductor has the same effect of achieving a large grain size even if it is subjected to the above-mentioned laser heat treatment.

Embodiment 2

Figure 7:
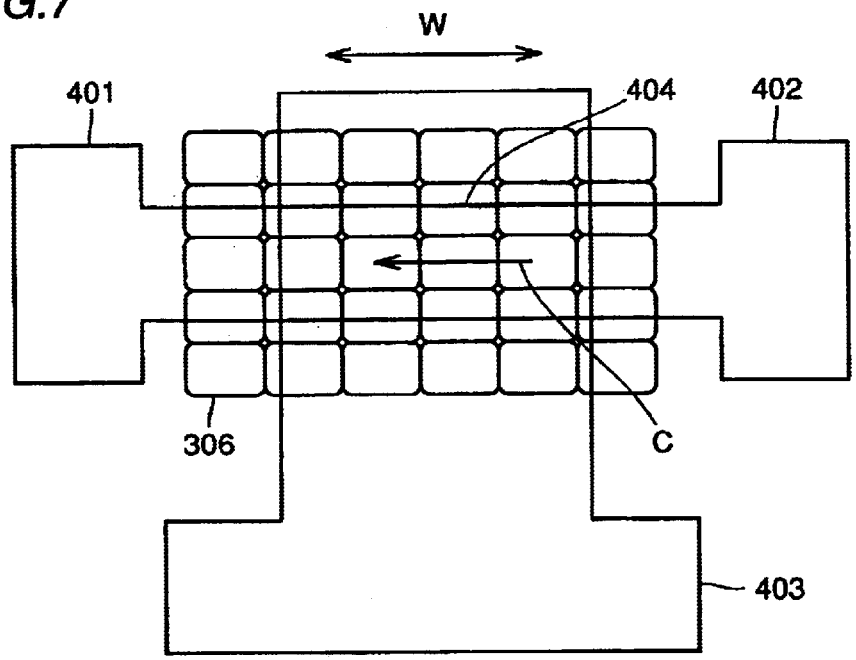
FIG. 7 is a schematic diagram showing a MOS transistor having its active layer formed from a polycrystalline silicon film formed by a laser heat treatment method of the present invention.

In Embodiment 2, a semiconductor device is described which is made on the heat-treated substrate material as described in Embodiment 1. As shown in FIG. 7, a MOS transistor element is formed which has its active layer formed from a polycrystalline silicon film formed by the heat treatment using the second harmonic of Nd:YAG laser as described in Embodiment 1. A source 401, a drain 402 and a channel 404 interposed between the source 401 and the drain 402 are formed in the active layer. A gate 403 is formed over the channel 404. By forming the transistor such that the width direction W of the linear beam, i.e., the crystal-growth direction, corresponds to the drain-current flowing direction C, the variation in crystal orientation at the boundary planes of individual crystal grains 306 is eliminated, whereby the carriers are not scattered at the boundary planes. Moreover, the crystal-defect density at the grain boundaries is reduced due to the extremely small grain boundaries, whereby the mobility of the transistor is significantly improved. Accordingly, a transistor operated at a higher frequency among the transistors to be formed on the substrate is made such that the width direction W of the linear beam, i.e., the crystal growth direction, corresponds to the drain-current flowing direction C, a device capable of operating at up to a high frequency can be obtained. Moreover, in the method of present invention, not only the grain size and thus the mobility of the transistor are increased, but also the conditions for obtaining the maximum mobility of the transistor are not critical in terms of the laser irradiation energy density. Accordingly, the transistors having a constant characteristic can be advantageously obtained even if the laser intensity is slightly varied.

Embodiment 3

In Embodiment 3, the shape of the linear beam is described. Regarding the line-shaped irradiated region, the experimentation of Embodiment 1 was conducted so that the region of 50 $\mu$m×10 mm was irradiated. As described above, however, the length of the irradiated region need only be about 10 times or more of the width in order for the laser irradiation to produce the lateral temperature distribution within the silicon film only in the direction orthogonal to the length direction of the linear beam, and to cause the crystal growth mainly in a one-dimensional direction. In other words, the laser light need only have a width of 50 to 100 $\mu$m and a length of 1 mm or more.

Embodiment 4

In Embodiment 4, the irradiation intensity in the laser heat treatment of Embodiment 1 is described. First, the upper limit of the irradiation intensity in the laser heat treatment using the second harmonic of Nd:YAG laser is described. As the irradiation energy density was increased, the silicon film was ablated at the irradiation energy density exceeding 1,500 mJ/cm$^2$ and completely removed away from the substrate. Accordingly, it was found that the irradiation energy density of laser light must be 1,500 mJ/cm$^2$ or less. Regarding the lower limit of the irradiation intensity, it was observed that the amorphous silicon film was changed to the polycrystalline film at approximately 100 mJ/cm$^2$ or more. Thus, the effect of the heat treatment can be obtained at the irradiation intensity of approximately 100 mJ/cm$^2$ or more. In view of the grain size, mobility of the transistor upon making a semiconductor device, and the like, 400 mJ/cm$^2$ or more is preferred.

Embodiment 5

Figure 8:
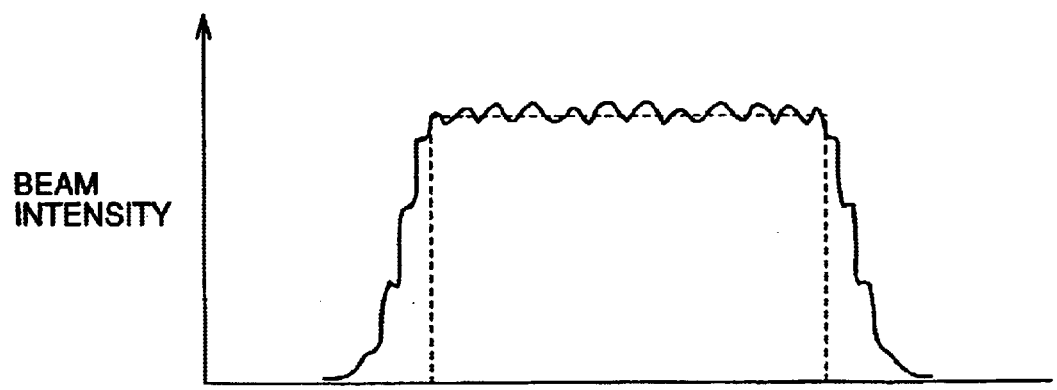
FIG. 8 is a schematic diagram showing a beam-intensity distribution in the line direction of a linear beam profile having interference.

In Embodiment 5, the number of times the laser is directed onto the same portion in the laser heat treatment of Embodiment 1 is described. In the irradiation experimentation conducted in conjunction with the present invention, significant surface roughness and partial film removal due to ablation occurred when the laser was directed a hundred times or more, thereby making it impossible to make a thin film transistor. Such surface roughness and ablation are caused by both the silicon film and laser light. In the silicon film, an uneven heat distribution is produced by laser irradiation due to a non-uniform thickness and density of the film. The laser light has a beam profile having ripples thereon due to interference such as speckles. This state is shown in FIG. 8. FIG. 8 shows a specific distribution of the linear-beam profile in the length direction. Ripples are produced by the interference, which make the distribution in this direction slightly uneven. It is extremely difficult to fundamentally eliminate such problems. In fact, the first irradiation produces slight surface roughness, which results in the non-uniformity in the second irradiation. Such a vicious circle is repeated, so that the surface roughness is interactively increased with the increase in the number of times of irradiation. It was confirmed that, by limiting the number of times of irradiation to 100 or less, the surface roughness does not hinder the production of a thin film transistor.

Embodiment 6

In Embodiment 6, the thickness of the amorphous or polycrystalline silicon film used as a target in the laser heat treatment of Embodiment 1 is described. In the case of conducting the laser heat treatment while moving the glass substrate, the laser is directed onto the same portion a plurality of times, which means that the heat treatment is repeated at the same portion a plurality of times. First, the polycrystalline silicon film having a large grain size is formed by the first several irradiations. As a result, the polycrystalline silicon film generally has a higher absorption coefficient in a crystal-defect portion such as at the grain boundaries than in an excellent crystal portion. In other words, the crystal-defect portion absorbs a larger quantity of laser light. As a result, the crystal-defect portion is first heat-treated, thereby enabling efficient compensation for the defects. Accordingly, the depth to which the light reaches becomes very important. A penetration depth for a substance is defined by the depth at which the light intensity is reduced to 1/e. The second harmonic of Nd:YAG laser has a penetration depth of about 100 to 200 nm for polycrystalline silicon. Accordingly, a polycrystalline silicon film having an efficiently reduced number of crystal defects is formed if the amorphous or polycrystalline silicon film has a thickness of less than 200 nm, and preferably, less than 100 nm.

Embodiment 7

In Embodiment 7, an impact of the pulse duration of the emitted laser light in the laser heat treatment of Embodiment 1 is described. Basically, in order to heat-treat an amorphous silicon film, the pulse duration enough to supply the heat energy required for melting the film must be applied within the peak power that is equal to or less than a prescribed value and that does not cause surface ablation. However, if prescribed melting conditions are satisfied, excessively increased pulse duration undesirably increases laser output, thereby reducing the efficiency and production capability of a production apparatus. This time, the experimentation was conducted with the pulse duration of 60 ns. However, in order to slowly cool and recrystallize the film to improve the crystal quality, efficient, non-ablative heat treatment can be conducted with the pulse duration of less than 200 ns that is several times 60 ns, and preferably, less than 100 ns that is about twice 60 ns.

Embodiment 8

In Embodiment 8, the laser-light energy in the laser heat treatment of Embodiment 1 is described. In the experimentation of Embodiment 1, an optimal property was obtained with the energy intensity of 800 mJ/cm$^2$ per pulse at the irradiated position. At this time, the total irradiation energy was 4 mJ/pulse. The laser light emitted from the oscillator is lost by 10 to 20% in the intermediate optical system. In other words, the laser light emitted from the oscillator need only have the energy of 5 mJ/pulse or more. As the laser light has higher energy per pulse, it can be directed onto a wider area. In the case of the present invention, the length of the linear beam can be increased, whereby the production capability can be improved. Note that, for the lower limit of the linear beam as described above, i.e., in order for a region of 1 mm long to be irradiated with the irradiation laser light having a width of 50 $\mu$m, a laser oscillator of at least 0.5 mJ/pulse is required. Moreover, in view of the production capability, it would be extremely advantageous if a region of 25 mm (1 inch) long can be irradiated with a single pulse. For example, this is because a region of a thin film transistor (TFT) that is about 1.3 inches in diagonal can be scanned by a single beam as a semiconductor device to be made. In this case, the laser oscillator of 15 mJ/pulse is required. As described above, the effect of the linear beam according to the present invention is obtained by the laser oscillator of 0.5 mJ/pulse or more, and the laser oscillator of 15 mJ/pulse or more is preferable in view of the production capability.

Embodiment 9

In Embodiment 9, the laser for use in the laser heat treatment of Embodiment 1 is described. The laser irradiation using the second harmonic of Nd:YAG has been described in Embodiment 1. In the case of the second harmonic of Nd:YAG, high output can be obtained due to its efficiency, whereby productive heat treatment can be achieved. According to the principle of the present invention, irradiation laser is basically determined by an absorptance of the laser light in amorphous silicon. Therefore, a film having a large grain size can be made as long as the pulse laser light has an absorptance of the same order and wavelength of 350 nm to 800 nm. Accordingly, in addition to the second harmonic of Nd:YAG laser, the heat treatment may be conducted using: a harmonic of other Nd ion-doped solid-state lasers such as a third harmonic of Nd:YAG laser, a second or third harmonic of Nd:glass laser, and a second or third harmonic of Nd:YLF laser; a second or third harmonic of Yb ion-doped solid-state lasers such as Yb:YAG and Yb:glass; or a fundamental or second harmonic of Ti:Sapphire laser. These solid-state lasers are capable of efficient, stable oscillation. Particularly in a solid-state laser using the crystal such as YAG or YLF as a medium, a pulse repetition frequency of the pulse oscillation can be increased, whereby excellent production capability can be achieved.

Embodiment 10

Although laser heat treatment using a linear beam profile is conventionally conducted with the excimer laser, such heat treatment is based on a concept fundamentally different from that of the heat treatment using laser light having a wavelength of 350 nm or more. In the heat treatment using the laser light having a wavelength of 350 nm or more, the crystal growth in the recrystallization process proceeds laterally, i.e., in the in-plane direction of the film, so that a grain size can be increased. However, in the heat treatment using the excimer laser, the crystal growth proceeds vertically, i.e., in the thickness direction of the film, whereby it is difficult to increase a grain size. The heat treatment using the line excimer-laser beam merely improves the in-plane uniformity of the film quality after the heat treatment and production capability.

Figure 9:
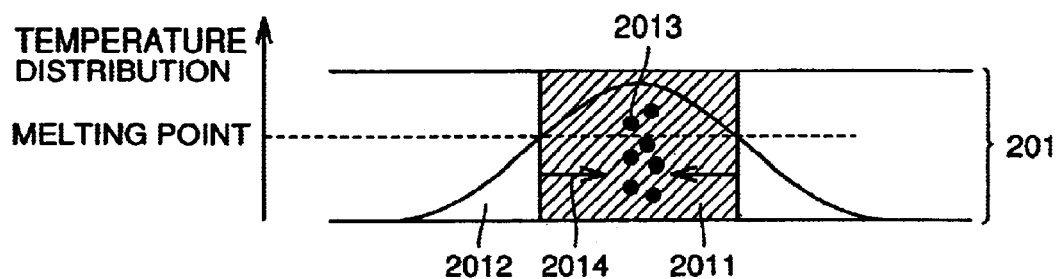
FIG. 9 is a schematic diagram showing a recrystallization process by a laser heat treatment method of the present invention.

The lateral growth process in the above-mentioned heat treatment using the laser light having a wavelength of 350 or more is highly influenced by the temperature distribution produced laterally within the silicon film. In other words, the lateral growth process is highly influenced by the energy-density distribution in the width direction of the emitted linear beam. The heat introduced into the silicon film by the laser-light irradiation is evenly dispersed into the substrate. In other words, the lateral temperature distribution within the silicon film is evenly reduced. As shown in FIG. 9, silicon film 201 subjected to the laser heat treatment consists of a melted portion (liquid phase) 2011 and a solid phase 2012. In melted portion 2011 of the silicon film 201, crystal growth proceeds laterally in the direction shown by 2014 from a portion that is cooled earlier to a temperature lower than the melting point toward a portion that is cooled later to a temperature lower than the melting point. This crystal growth 2014 is prevented by microcrystal 2013 grown by natural nucleation during reduction in the temperature, and the lateral crystal growth is stopped. In other words, the crystal grains need only be grown as long as possible prior to such natural nucleation. This requires a high crystal-growth rate. In general, crystal-growth rate v in a minute region is given as the expression of $v=k\Delta T/\Delta x$, where k is a rate constant, $\Delta T$ is a difference in temperature in the minute region, and $\Delta x$ is a width of the minute region. More specifically, when the silicon film has a temperature distribution in its lateral direction, the crystal growth rate would be increased and thus the polycrystalline silicon film having a large grain size could be formed if the temperature distribution has a steep gradient in the region having a temperature equal to or higher than the melting point. Regarding a practical problem, i.e., the steep gradient of the lateral temperature distribution within the silicon film, such steep gradient can be realized by causing the irradiation energy-density distribution to have a steep gradient at the target surface.

Hereinafter, actual data of the present invention is described. Laser heat treatment was conducted in a manner similar to that of Embodiment 1 as described above with reference to FIGS. 1 to 5. The second harmonic of Nd:YAG laser used as a pulse laser source had pulse energy of 20 mJ/pulse, and pulse duration of 60 nsec (FWHM. Moreover, the beam-irradiated area of the silicon film surface was 50 $\mu m \times 10$ mm or 250 $\mu m \times 10$ mm. Experimentation was conducted with the laser-light energy being adjusted by variable attenuator 103 of FIG. 1 to the irradiation energy density of 300 to 1,000 mJ/cm$^2$ (which is the total irradiation energy divided by the beam-irradiated area). The maximum gradient of the irradiation-energy-density distribution in the width direction of the linear beam was 4 mJ/cm$^2$/$\mu$m (irradiated area of 250 $\mu m \times 10$ mm, and irradiation energy density of 800 mJ/cm$^2$) and 30 mJ/cm$^2$/$\mu$m (irradiated area of 50 $\mu m \times 10$ mm, and irradiation energy density of 800 mJ/cm$^2$). The laser was directed onto the same portion of the silicon film twenty times. Note that the atmosphere was in the air, and the substrate temperature was a room temperature.

Hereinafter, a method for determining a gradient of the irradiation-energy-density distribution is described. First, a linear beam profile at the irradiated position on the surface of the amorphous silicon film, i.e., an irradiation-energy-density distribution, is measured. This irradiation-energy-density distribution is herein a distribution of the energy in a single pulse directed onto a certain minute portion converted to the energy per unit area. The irradiation-energy-density distribution is generally expressed in mJ/cm$^2$. Measurement is conducted in the length and width directions of the linear beam by using a linear image sensor that is formed from a one-dimensional array of photodiodes. A two-dimensional irradiation-energy-density distribution obtained by such measurement represents a relative value, and does not yet have an absolute value. An integral value is obtained which is the two-dimensional irradiation-energy-density distribution as obtained by the actual measurement integrated with respect to the area. By setting the measured irradiation-energy distribution so that the energy per pulse of the entire laser beam is equal to the integral value, the resultant irradiation-energy-density distribution represents an absolute value. The above-mentioned energy per pulse of the entire laser beam is separately measured by a measuring apparatus for measuring the energy of the entire laser beam, such as a power meter. The gradient of the irradiation-energy-density distribution is the resultant absolute value of the irradiation-energy-density distribution differentiated with respect to the position.

Figure 10:
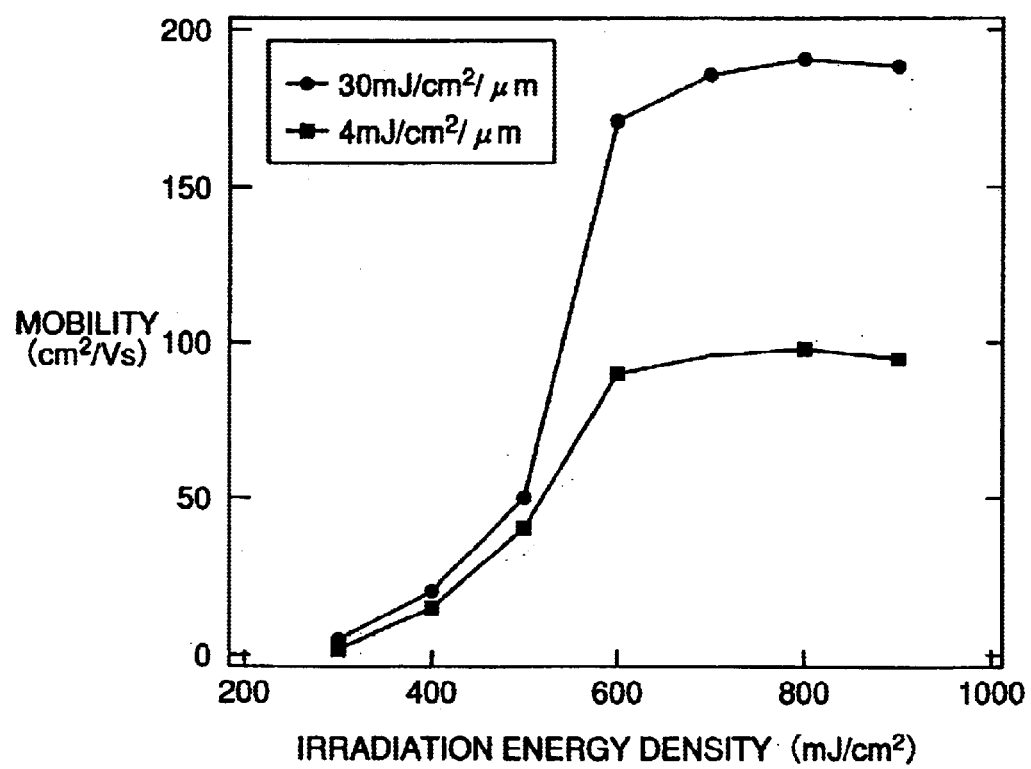
FIG. 10 is a diagram showing, for each irradiation-energy-density gradient, dependence of mobility of an NMOS transistor on irradiation energy density, wherein the NMOS transistor has its active layer formed from a polycrystalline silicon film obtained by a laser heat treatment method of the present invention.
Figure 11:
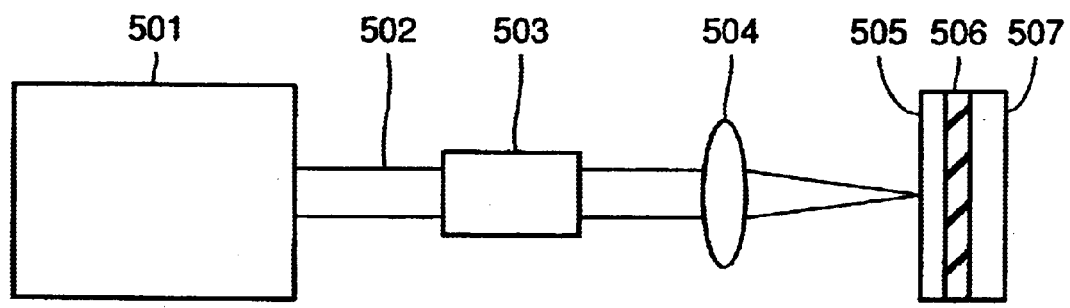
FIG. 11 is a diagram showing a conceptual structure of a conventional laser heat treatment apparatus using excimer laser.
Figure 12A:
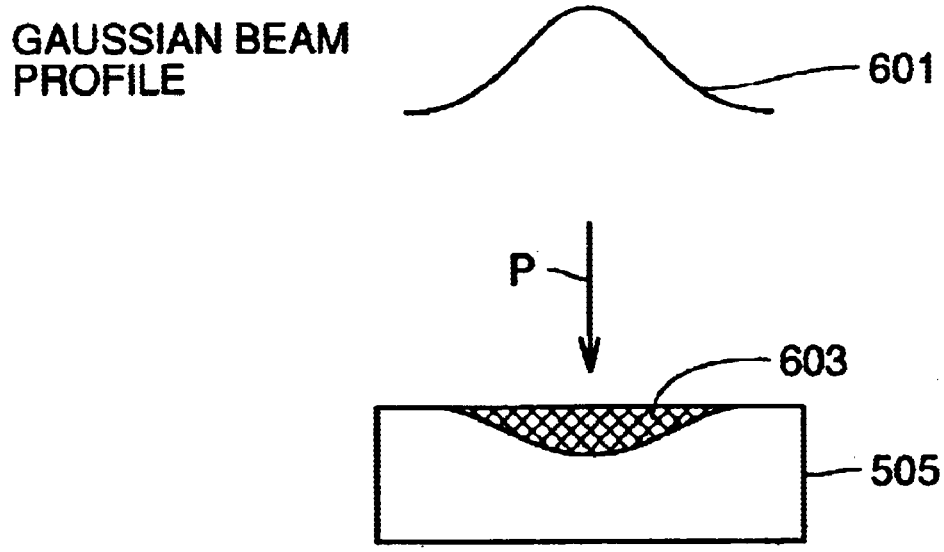
FIGS. 12A to 12D are diagrams schematically illustrating a conventional heat treatment process using excimer laser.
Figure 12B:
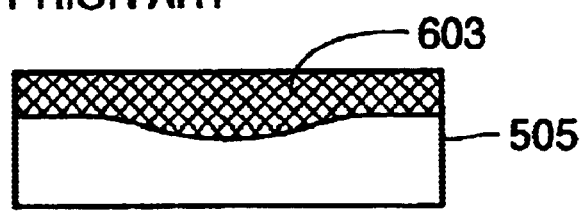
Figure 12C:
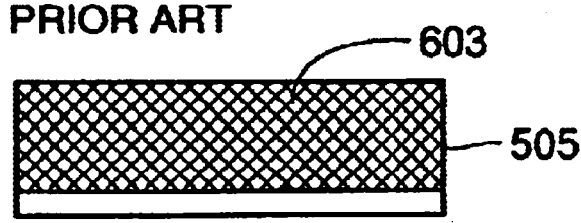
Figure 12D:
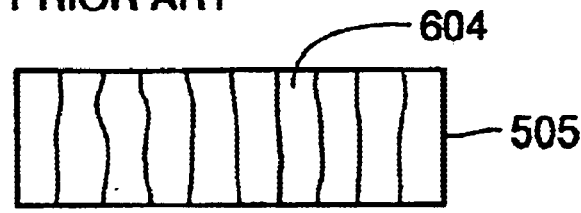

Under such conditions, the laser heat treatment of the amorphous silicon film was conducted. The grain size of the resultant polycrystalline silicon film was as follows: when the maximum gradient of the irradiation-energy-density distribution in the width direction of the linear beam was 4 mJ/cm$^2$/$\mu$m (irradiation intensity of 800 mJ/cm), the crystal grains had a length of about 1 $\mu$m in the beam scanning direction. However, with the maximum gradient of 30 mJ/cm$^2$/$\mu$m (irradiation intensity of 800 mJ/cm$^2$), such a length of the crystal grains was about 3 $\mu$m, which is three times as large. This results from the difference in a crystal growth rate that is dependent on the difference in steepness of the temperature distribution based on the irradiation-energy-density distribution. Planar MOS transistors having their active layers formed from these polycrystalline silicon films were made. The MOS transistors were made so as to have a drain current flowing in the beam-scanning direction, i.e., in the crystal-growth direction. The channel length and width are 5 $\mu$m and 10 $\mu$m, respectively. Dependence of the n-channel mobility on the irradiation energy density is shown in FIG. 10. As shown in FIG. 10, when the maximum gradient of the irradiation-energy-density distribution in the width direction of the linear beam was 4 mJ/cm$^2$/$\mu$m at the irradiation intensity of 800 mJ/cm$^2$ (irradiation intensity of 800 mJ/cm$^2$), the MOS transistor had somewhat low n-channel mobility of about 100 cm$^2$/Vs at the irradiation intensity of 600 mJ/cm$^2$ (the maximum gradient of the irradiation-energy-density distribution of 3 mJ/cm$^2$/μm) or more. However, in the case of 30 mJ/cm$^2$/μm (irradiation density of 800 mJ/cm$^2$), extremely high mobility of about 200 cm$^2$/Vs was achieved. The reason why the mobility of the MOS transistor is significantly different depending on the gradient of the irradiation energy density is that the number of times for the carriers to move across the grain boundaries in the active layer of the MOS transistor is different due to the difference in length of the grains. In order to make an integrated circuit requiring high speed and functionality, the mobility of approximately 100 cm$^2$/Vs is required. Accordingly, the laser heat treatment must be conducted using such a linear beam profile that the irradiation-energy-density distribution has the maximum gradient of about 3 mJ/cm$^2$/μm or more.

Although silicon has been herein described as the film material, it should be understood that silicon carbide (SiC), or a material consisting only of carbon, or a compound semiconductor, or a dielectric compound, or a high-temperature superconductor compound has the same effect of achieving a large grain size even if it is subjected to the above-mentioned laser heat treatment.

In Embodiment 10, the linear beam has a Gaussian distribution profile in the width direction. The Gaussian distribution profile in the width direction has a highly advantageous effect during the laser heat treatment. As shown in FIG. 9, in the case where the profile in the width direction, i.e., the linear-beam scanning direction, is a Gaussian distribution profile, the silicon film is irradiated also with the laser-light energy that is distributed outside the central region in which the laser light for heating the silicon film to a melting point or more for melting has a threshold intensity or more. Therefore, such laser light, while being at the melting point or less, also heats the silicon substrate. In other words, a portion of the laser light that has an intensity of a melting threshold or less on the opposite side to the scanning direction has a post-anneal effect.

Post-annealing further improves the crystalline property of the polycrystalline silicon film resulting from recrystallization. Since the silicon has a low absorption coefficient for the second harmonic of Nd:YAG laser, the penetration depth, as defined by the depth at which the laser-light intensity is reduced to 1/e in the silicon film, is 100 nm or more. Accordingly, compensation for the crystal defects can be conducted nearly up to the rear surface of the recrystallized silicon film, thereby further improving the crystalline property. This effect cannot be expected to be obtained in the conventional heat treatment using excimer laser light. This is because the silicon has an extremely high absorption coefficient for the excimer laser light and the penetration depth is only about several tens of nanometers.

Embodiment 11

In Embodiment 11, description is given about the case where the energy-density distribution in the width direction of the linear beam has a top-flat profile in the laser heat treatment of Embodiment 10. In the case where the steepness of the gradient of the irradiation energy density in the width direction of the linear beam is increased, the peak value is increased with the increase in steepness. If the peak value is too high, the silicon film is ablated and removed away from the substrate, thereby making it impossible to make the thin film transistor. Accordingly, the peak value must be suppressed while the steepness is increased. A top-flat profile is appropriate as a profile satisfying the foregoing conditions.

Embodiment 12

In Embodiment 12, an energy-distribution profile in the length direction of the linear beam in the laser heat treatment of Embodiment 10 is described. In Embodiment 10, the energy-distribution profile in the length direction is a top-flat profile. However, it is difficult to obtain a completely uniform profile due to the interference resulting from coherence of the laser light, and the actual profile has some ripples thereon as shown in FIG. 8. As can be seen from FIG. 10, the MOS transistor formed from the polycrystalline silicon film obtained by the laser heat treatment of the second harmonic of Nd:YAG laser has a constant characteristic for the irradiation energy density at 600 mJ/cm$^2$ or more. Accordingly, the energy distribution in the length direction of the linear beam need only have a standard deviation of 0.3 or less, and preferably, about 0.2 or less, provided that the intensity of the flat portion is 1.

Embodiment 13

As in the case of the laser heat treatment of Embodiment 1, a semiconductor device, shape of the linear beam, irradiation intensity, the number of times of laser irradiation onto the same portion, thickness of the amorphous or polycrystalline silicon film, pulse duration of the irradiation laser light, laser-light energy, and laser as described in each of Embodiments 2 to 9 are also applicable to the laser heat treatment of Embodiment 10.

The embodiments as disclosed above are by way of illustration and example only, and are not to be taken by way of limitation. The scope of the present invention is not defined by the foregoing embodiments, but rather defined by the appended claims, and includes all the changes and modifications falling within the equivalent and scope of the appended claims.

The laser heat processing method and apparatus of the present invention may be utilized to form a polycrystalline silicon film having an excellent crystalline property in order to fabricate a high-mobility thin film transistor applied to, for example, a pixel portion of a liquid crystal panel. Moreover, a semiconductor device produced by using the laser heat treatment method and apparatus of the present invention may be applied to a thin film transistor forming, for example, a pixel portion of a liquid crystal panel.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A laser heat treatment apparatus, comprising:

a pulse laser source having a wavelength of 350 nm to 800 nm and linear-beam-forming optical means for forming a laser beam generated from the pulse laser source into a linear beam, wherein said linear beam has an energy density gradient of at least 3 mJ/cm$^2$ μm in a width direction thereof.

2. The laser heat treatment apparatus to claim 1, wherein said pulse laser source is a harmonic of Q-switched oscillating solid-state laser using Nd ion- or Yb ion-doped crystal or glass as a laser excitation medium.

3. The laser heat treatment apparatus according to claim 2, wherein said pulse laser source is one selected from the group consisting of a second harmonic of Nd: YAG laser, a third harmonic of Nd: YAG laser, a second harmonic of Nd glass laser, a third harmonic of Nd glass laser, a second harmonic of Nd: YLF laser, a third harmonic of Nd: YLF laser, a second harmonic of Yb: YAG laser, a third harmonic of Yb: YAG laser, a second harmonic of Yb: glass laser, and a third harmonic of Yb: glass laser.

* * * * *

UNITED STATES PATENT AND TRADEMARK OFFICE
CERTIFICATE OF CORRECTION

PATENT NO. : 6,753,548 B2
DATED : June 22, 2004
INVENTOR(S) : Tetsuya Ogawa et al.

It is certified that error appears in the above-identified patent and that said Letters Patent is hereby corrected as shown below:

Column 16,
Line 54, change "3 mJ/cm$^2$ μm" to -- 3mJ/cm$^2$/μm --.

Signed and Sealed this

Third Day of January, 2006

JON W. DUDAS
*Director of the United States Patent and Trademark Office*